United States Patent
Brown et al.

(10) Patent No.: US 6,252,173 B1
(45) Date of Patent: Jun. 26, 2001

(54) BAUXITE FLAME-RETARDANT FILLERS FOR INSULATORS OR SHEATHING

(75) Inventors: Steve Brown, Uxbridge; Natalie Mead, Banbury; Ken Evans, Chalfont St Peter, all of (GB); Consuelo Espejo Rodriguez, Madrid (ES); Andrew John Dayer, Banbury (GB)

(73) Assignee: Alcan International Limited, Montreal (CA)

( * ) Notice: Subject to any disclaimer, the term of this patent is extended or adjusted under 35 U.S.C. 154(b) by 0 days.

(21) Appl. No.: 09/254,372

(22) PCT Filed: Sep. 12, 1997

(86) PCT No.: PCT/GB97/02494

§ 371 Date: Sep. 15, 1999

§ 102(e) Date: Sep. 15, 1999

(87) PCT Pub. No.: WO98/11158

PCT Pub. Date: Mar. 19, 1998

(30) Foreign Application Priority Data

Sep. 12, 1996 (EP) .................................................. 96306627

(51) Int. Cl.[7] ............................... H01B 3/28; H01B 3/44; H01B 7/282; H01B 7/295; C08K 3/22

(52) U.S. Cl. ................................ 174/110 R; 174/110 AR; 174/110 SR; 174/110 PM; 174/110 V; 174/110 A; 174/118; 524/430

(58) Field of Search ........................ 524/430; 174/110 R, 174/110 AR, 110 SR, 110 PM, 110 V, 110 A, 118

(56) References Cited

U.S. PATENT DOCUMENTS

| 4,126,473 | 11/1978 | Sobolev et al. |
|---|---|---|
| 4,216,130 | * 8/1980 | Rigge et al. ........................ 260/29.7 |
| 4,390,653 | 6/1983 | Levendusky et al. |
| 5,378,539 | * 1/1995 | Chen ..................................... 428/378 |
| 6,005,192 | * 12/1999 | Mashikian et al. .............. 174/110 R |

FOREIGN PATENT DOCUMENTS

| 630 941 | * 12/1994 | (EP) ............................... C08L/51/00 |
|---|---|---|
| 1506154 | 4/1978 | (GB) . |
| WO 9509426 | * 4/1995 | (WO) .............................. H01B/7/28 |

OTHER PUBLICATIONS

World Patent Index Abstract, No. XP 002048460, corresponding to Japanese Patent No. 01294792, Nov. 28, 1989.
World Patent Index Abstract, No. XP 002048461, corresponding to Japanese Patent No. 05017692, Jan. 26, 1993.

* cited by examiner

*Primary Examiner*—David W. Wu
*Assistant Examiner*—Kelechi Egwim
(74) *Attorney, Agent, or Firm*—Cooper & Dunham LLP

(57) ABSTRACT

Bauxite, particularly high alumina bauxite, and brucite are used as flame-retardants in non-aqueous organic polymer formulations particularly for electric insulation or sheathing or encapsulation, and also in bitumen. The formulations are suitable for shaping e.g. by casting, moulding or curing at temperatures of 150° C. or 200° C. Water resistance and other properties including cost of bauxite and brucite compare favourably with the conventional flame-retardant aluminium trihydrate.

6 Claims, No Drawings

BAUXITE FLAME-RETARDANT FILLERS FOR INSULATORS OR SHEATHING

This invention concerns the use of bauxite or brucite as flame-retardants in non-aqueous organic polymer formulations, particularly in electric insulation or sheathing or encapsulation compositions, and also in bitumen.

Bauxite ore contains 40–70% aluminium containing minerals consisting mostly of Gibbsite (a crystalline form of aluminium trihydroxide or ATH) and Boehmite. These ores also contain many mineral impurities including silicates, iron and titanium compounds and organic compounds especially humates.

Brucite is a mineral widely used as a source of magnesium hydroxide ($Mg(OH)_2$), the second largest selling (after ATH) mineral hydroxide flame-retardant. Its volume use as a flame-retardant is only a fraction of ATH however. It is more thermally stable than ATH, decomposing at temperatures above 300° C.

Aluminium trihydroxide (ATH) is very widely used as a flame-retardant additive in various organic polymer formulations. ATH has the valuable property (which magnesium hydroxide also shares) of decomposing endothermically, at temperatures around those at which organic polymers tend to ignite, with the release of non-toxic gas (steam) which tends to exclude oxygen. ATH is made by the Bayer process from bauxite. As it has other uses, particularly as a raw material to make alumina for use in smelters for the production of metallic aluminium, it commands a premium price. There is a need for a cheaper flame-retardant having the advantageous properties of ATH. This need has existed for several decades.

U.S. Pat. No. 4,126,473 and U.S. Pat. No. 4,390653 mention bauxite as an alternative flame-retardant to ATH. U.S. Pat. No. 4,216,130 describes the use of bauxite as a flame retarding filler in rubber latex compositions for carpet backing. Critical limits are placed on particle size and surface area and pH, in order that the bauxite may perform satisfactorily in the polymer foam compositions. GB 1506154 describes the use of bauxite as a flame-retardant in polyurethane foam formulations; coarse particles or aggregates were used in order to obtain adequate foam stability. Perhaps because of this destablisation problem, bauxite has never achieved commercial success as a flame-retardant in latex or polyurethane foams, nor indeed in any other polymer formulations.

Polymer formulations for use in the electricity and electronics industries need to comply with varied and demanding criteria, e.g. as defined in Underwriters Laboratories Publication UL44. A major use is as insulation and sheathing for electric or fibre optic wires and cables; where such wires and cables are exposed to atmospheric or marine environments, excellent water resistance is required. Excellent mechanical properties are also required for cable sheathing. Another use is in potting compositions used to coat or encapsulate electric or fibre optic components and connections e.g. on circuit boards or as transformer coils; again, excellent water resistance is required for external or marine environments. Of course, excellent flame-retardant properties are also required in all cases.

This invention is based on the discovery that in many instances the relevant properties of bauxite are substantially or at least as good as those of ATH. Since bauxite is much cheaper than ATH, this discovery has significant commercial implications. Since bauxite contains a large proportion of ATH, the reasons for any improvement are not obvious; perhaps it results from a synergistic effect between the ATH and iron oxide or one of the other mineral components of bauxite.

Bauxite typically contains 10% or more of (non-alumina) impurities of composition that depends on where the mineral has been mined. It was surprising (to the inventors) to discover that these impurities do not materially harm the properties of bauxite (viz a viz ATH), even in demanding applications such as electric component insulation and sheathing and encapsulation.

The mineral brucite also contains significant and variable concentrations of various non-magnesia impurities. Again, it would have been expected that those impurities might harm the properties of brucite when used as a flame-retardant in technically demanding electrical applications.

One impurity which is generally absent from both bauxite and brucite is soluble alkali metal compounds generally measured as soda. By contrast, as a result of its production by the Bayer process, ATH contains measurable soda. On account of this difference in soda content, polymer formulations containing bauxite or brucite often have better water resistance than do comparable formulations containing ATH.

In one aspect, this invention provides a non-aqueous organic polymer formulation which contains an effective concentration of bauxite or brucite as a flame-retardant. Preferably the invention consists essentially of the organic polymer and the bauxite or brucite flame-retardant, optionally together with other typical formulation ingredients in usual concentration. Preferably the formulation is of a quality which is suitable for shaping into a solid product for use as electric or fibre optic insulation or sheathing or encapsulation.

In another aspect the invention provides electric or fibre optic wire or cable provided with insulation or sheathing which is an organic polymer containing an effective concentration of bauxite or brucite as a flame-retardant.

In another aspect the invention provides an electric or fibre optic component or connection coated with or encapsulated in an organic polymer containing an effective concentration of bauxite or brucite as a flame-retardant.

In yet another aspect the invention provides bitumen containing an effective concentration of bauxite or brucite as a flame-retardant. As shown in the examples below, the overall performance of bauxite and brucite as flame-retardants in bitumen is substantially superior to that of ATH.

The non-aqueous organic polymer formulation may be suitable for shaping by melting, casting, extruding, moulding, curing and other techniques well known in the field. The formulation is based on an organic polymer which may be natural rubber or a synthetic resin, plastic or elastomeric, thermoplastic or thermosetting. The following are polymers used for wire and cable applications.

ethylene propylene terpolymer rubber (EPDM)
ethylene propylene rubber (EPR)
isoprene isobutylene (butyl) rubber (IIR)
acrylonitrile butadiene copolymer rubber (NBR)
natural rubber (NR)
polychloprene rubber (PCP)
styrene butadiene rubber (SBR)
silicone rubber (SR)
polyisobutylene (PIB)

with the above able to be either thermoplastic rubber or vulcanised rubber;
polyester
polyacrylate
epoxy
polyurethanes (PUR)
polycarbonate
polyolefins polypropylene (PP)
ethylene tetra fluoroethylene (ETFE)
ethylene vinyl acetate (EVA)
chlorinated polyethylene (CPE)
chlorosulphonated polyethylene (CSP)
polytetrafluoroethylene (PTFE)
polyethylene tetraphthalate (PETP)
high density polyethylene (HDPE)
very high density polyethylene (VHDPE)
low density polyethylene (LDPE)
ultra low density polyethylene (ULDPE)
linear low density polyethylene (LLDPE)
crosslinked polyethylene
polycarbonate
polyvinyl acetate (PVA)
polyvinyl chloride (PVC)
and any of the above polymers produced with metallocene catalyst technology.

Epoxy, polyester, acrylic and phenolic are examples of polymer systems generally used for potting and encapsulation of electric and fibre optic components and connections.

Other typical formulation ingredients are listed below, and would be used in usual concentrations according to manufacturers recommendations.
vulcanising/cross linking systems
stabilisers including UV stabilisers
antioxidants
plasticisers
lubricants
colorants
impact modifiers
other flame retardants
processing aids
carbon black
coupling agents
silanes
fibres
gloss control agents
anti shrink additives
halogen source.

The term "non-aqueous" is intended to exclude water-based latex systems and other formulations containing significant amounts of water for example as a solvent for catalysts or other additives. Formulations according to the invention are generally substantially or completely free of water, although the presence of small amounts of adventitious water is not necessarily a problem.

Electric wire consists of a current-carrier surrounded by insulation. In electric cable, insulation surrounding a current-carrier is itself surrounded by sheathing which contributes to the mechanical, electrical and other properties of the cable. Electric wire or cable would include low, medium and high voltage cable, power cable, communications cable, distribution cable, fibre optic cable. The terms "electric component" and "electric connection" are used broadly to cover all those current carriers which are surrounded by or coated with or encapsulated in protective insulation. In fibre optic cables, a light carrier is used instead of a current carrier; but the need for protective sheathing and insulation are generally the same as for electric cables. Optic fibre cables are often exposed to wet conditions e.g. underground or underwater. Ingress of water causes loss of performance of glass fibres, either through corrosion or by other means.

The electric wire or fibre optic or cable or component or connection may be made by shaping the organic polymer formulation as defined at a temperature of above 100° C., particularly above 150° C. Many polymer formulations are shaped at temperatures around 200° C. (e.g. 180–220° C.) and in these formulations the thermal stability of any flame-retardant is of critical importance. Polypropylene, polystyrene, bitumen, EVA, EPR, EPMD and some polyesters are examples of materials that can be shaped at these temperatures. EPA 377 881 which provides a method of treating ATH to improve its thermal stability, indicates the severity of the problem. As demonstrated below, bauxite and brucite materials have thermal stabilities as good as or better than conventional ATH.

Such polymer products are often formulated to have water-resistant properties, so as to withstand frequent or constant contact with water in vapour or more particularly liquid form. The extent to which such polymer products absorb water is an important property; as demonstrated below, formulations containing bauxite or brucite as a flame-retardant often have lower water absorption than comparable formulations containing conventional ATH.

Bauxite derived from different mines, and indeed from the same mine, has quite variable compositions. Preferred for use in this invention is high alumina bauxite, by which is meant bauxite containing at least 57% by weight of $Al_2O_3$. The experimental work described below has been carried out using high alumina bauxite obtained from Africa and S. America and having the following compositions:

| | Bauxite Composition (wt %) | |
| --- | --- | --- |
| Component | HA Africa | HA S. America |
| Loss on ignition | 31.8 | 31.1 |
| $Al_2O_3$ | 58.5 | 57.9 |
| Ca O | 0.024 | 0.01 |
| $Fe_2O_3$ | 3.6 | 0.76 |
| Mg O | 0.016 | 0.01 |
| Si $O_2$ | 1.47 | 4.87 |
| Ti $O_2$ | 2.23 | 2.96 |
| Total Soda | <0.01 | <0.01 |
| Soluble Soda | <0.001 | <0.001 |

High alumina bauxite frequently has the advantage, which is more important for some applications than for others, of having less colour (mainly due to iron oxide impurities) than ordinary bauxite. The bauxite can be ground by conventional means to a particle size appropriate for the polymer formulation in which it is to be used.

Preferably the bauxite or brucite used has a very low soluble soda content (below 0.01% preferably below 0.001% by weight) and a very low total soda content (below 0.1% preferably below 0.02% or 0.01% by weight). This may be very important in applications, for example cable sheathing or insulation, where the product is exposed to water under conditions where sodium present has the effect of gradually reducing the dielectric properties of the insulation eventually leading to breakdown. Sodium also promotes faster ingress of water or water vapour than would otherwise be the case. Examples of systems where these disadvantages need to be reduced include cable sheathing and electrical housings and mouldings.

Bauxite or brucite ore may simply be mined and ground to the desired particle size for use as a flame-retardant. A preferred median particle size is in the range of 0.3–5.0 μm, with a preferred surface area of >10 m²/g. Optimum particle size and surface area may depend on the polymer formulation or the intended use of the product, as known in the art. Thus for example, a median particle size of about 1 μm gives maximum impact strength in polypropylene; but particle size is less important in polyvinylchloride. For electric and fibre optic cables, filler particle sizes of 1 μm or smaller give maximum tensile strength without significantly detracting from other properties.

Various grinding techniques are possible. A polyacrylate, phosphate or other dispersing agent may be used to minimise the amount of water needed for grinding; while this may involve the addition of soluble soda, the amount is insignificant. The use of such additives is known in some instances to enhance the processability of the filler in thermoplastics. The bauxite or brucite flameretardant may be coated, either during or after grinding, with a fatty acid, a silane or other surface modifying agent in order to improve polymer compatibility. However, a major advantage of bauxite and brucite flameretardants is their low cost, and this advantage is reduced if coatings or modifiers have to be applied. According to a preferred feature of the invention therefore the bauxite and brucite flame retardants are used uncoated.

This bauxite or brucite is used at conventional loadings, which may be from 20% up to 500% or even more by weight on the non-volatile solids content of the polymer.

For use as a flameretardant in polymer formulations, bauxite, particularly high alumina bauxite, and brucite may have the following advantages over ATH. Different advantages may be apparent or important in different applications:

Very low soda content resulting in decreased water absorption and improved electrical properties.

Improved thermostability, with the result that compounding conditions are less critical.

Generally, better properties for easier compounding with polymers.

Reduced viscosity of compounded polymer formulations.

Improved fire resistance, particularly in respect of time to ignition.

Improved smoke suppressant properties.

Dramatically reduced cost.

The following polymer formulations are particularly envisaged according to the invention:

(a) Cable sheathing (polyolefins and copolymers e.g. EVA and EPDM and also polyethylene itself particularly metallocene-polyethylenes). Low sodium content is certainly important here for best resistance to water penetration. The colour of the bauxite and brucite is not very important in most sheathing, which is usually black or brightly pigmented. However, any thermal stability improvements, of high alumina bauxites over ATH, is of significant benefit for cable manufacturers. It enables them to use more exotic polymers and/or to extrude hotter and faster and hence more cost effectively.

(b) Polypropylene. It is technically possible but difficult to compound ATH into polypropylene, because the melt temperatures involved are close to the decomposition point of ATH. The improved thermal stability and improved fire resistant properties of high alumina bauxite are expected to be of significant advantage.

(c) Thermosetting polymers (e.g. thermoset polyesters, acrylics, epoxies and phenolics). Improved thermal stability of high alumina bauxite is expected to be of real benefit in some of these applications, e.g. potting composition for encapsulating circuit boards or transformer coils. High alumina bauxites have been shown to perform effectively in unsaturated polyesters, which are probably the most sensitive thermosetting polymers.

(d) Rubber. As with cable sheathing (which is often rubber) benefits are expected from the use of ground high alumina bauxites and brucite in reduced water pick up due to the very low level of soda and other water soluble ionic impurities. Colour is not a significant issue in rubber formulations that are reinforced with carbon black.

(e) Bitumen. Again, colour is not an important factor because bitumen is already black. The examples below demonstrate good fire and smoke performance properties for African high alumina bauxite and brucite versus ATH in bitumen. Thermal stability improvement of high alumina bauxites and brucite over ATH is valuable in bitumen processing, particularly in instances when the flame-retardant has been mixed into the bitumen melt and is then left for extended periods at elevated temperature (typically 160–190° C.).

The following examples illustrate the invention.

EXAMPLE 1

Bitumen 60 g bitumen pieces were cut from a large sample and weighed into a metal can. This was heated at 170° C. for thirty minutes to melt. Then 12 g of pre-dried test material was added quickly and stirred vigorously using a hand held electric stirrer. This material was transferred to a 10 cm×10 cm rubber mould and replaced in an oven for a further thirty minutes to again melt and flow into the mould. It was then cooled and de-moulded. The filler loading at 20% was the highest that could be achieved using the laboratory equipment available, but the results are expected to reflect the results obtainable at higher commercial loadings of about 30%.

The following table reports cone calorimeter (ASTM 1354) results obtained using high alumina bauxite from Africa, and also brucite, with ATH included for comparison.

| Bitumen Results | | | | |
|---|---|---|---|---|
| Property | Unfilled | HA Africa Bauxite | ATH | Brucite |
| Time to ignition(s) | 58 | 70 | 56 | 79 |
| Time to extinction(s) | 1625 | 1225 | 923 | 933 |
| Peak HRR (KW/m$^2$) | 555 | 346 | 365 | 399 |
| Time to peak HRR (s) | 253 | 223 | 166 | 218 |
| Total HR (MJ/m$^2$) | 151 | 107 | 117 | 104 |
| Avg SEA (m$^2$/kg) | 1095 | 902 | 976 | 1005 |
| Total smoke release | 4639 | 2888 | 1883 | 3153 |
| Peak CO (g/m$^2$s) | 0.88 | 0.25 | 0.52 | 0.58 |
| Peak CO$_2$ (g/m$^2$s) | 34.0 | 21.1 | 21.9 | 24.5 |
| Mass loss (%) | 66.1 | 58.0 | 64.2 | 48.4 |

Cone Calorimetry Group Summary in Bitumen

A broader range of cone calorimetry test results can be used to provide cone calorimetry group summaries as set out in the table below. In all cases a positive value with reference to the control means better performance. (Reference: Herbert M., PVC Cable Sheathing with Improved Smoke Characteristics. FR96 Queen Elizabeth Conference Centre, London, January 96, Pub. Elsevier, pp 157–172, ISBN 0951632086).

| Property | Unfilled | HA Africa Bauxite | ATH | Brucite |
|---|---|---|---|---|
| Heat release | 0 | 5.4 | 2.4 | 3.8 |
| Smoke | 0 | 8.0 | 4.6 | 3.9 |
| Ignition | 0 | 5.6 | 2.1 | 6.3 |
| Mass loss | 0 | 0.3 | −2.1 | −0.6 |
| Time factors | 0 | 1.3 | 2.2 | 2.3 |
| Overall | 0 | 21.1 | 8.3 | 16.4 |

The overall performance of the high alumina bauxite and the brucite is seen to be substantially superior to ATH.

EXAMPLE 2

Comparison of High Alumina Africa and High Alumina S. America Bauxite and Alumina Trihydrate in Polyester Resin 100 g of Polyester Resin SB793C and 150 g of fire-retardant filler and 2% MEKP (methyl ethyl ketone peroxide) were mixed at room temperature, cast into moulds and allowed to cure.

High alumina Africa and high alumina S. America bauxite exhibit good fire performance in polyester. The fire performance index of the S. American material was almost identical to that of ATH. The polyester formulations containing both bauxite materials had much lower viscosity than the formulation containing ATH.

These were the characteristics of the bauxites tested in polyester resin:

| | HA Africa | HA S. America |
|---|---|---|
| $d_{50}$ ($\mu$m) | 18.1 | 18.8 |
| Sieves 300 BSS (% > 45 $\mu$m) | 6.1 | 28.7 |
| Loss on Ignition (%) | 31.1–31.8 | 30.1–33.9 |
| Moisture | 0.4 | 0.5 |
| $Al_2O_3$ (%) | 58.5 | 58 |
| (of which gibbsite) (%) | 84.4 | 83.4 |
| $SiO_2$ (%) | 1.5 | 6.3 |
| $Fe_2O_3$ (%) | 3.6 | 0.6 |
| $TiO_2$ | 2.2 | 3.7 |
| Surface Area $S_w$ ($m^2$/g) | 12.4 | 12.1 |

Samples were prepared with a loading of 150 phr of bauxite and viscosity, COI, Cone Calorimeter and Cure time (Gel time trials) tests were undertaken. Samples with a loading of 100 phr were used for peak exotherm and time to exotherm tests. MEKP was added at 2% of the resin in all the tests except in viscosity. An amount of 0.5% of cobalt accelerator was needed to carry out the last four experiments. During the tests, ATH was found to be the most difficult to mix whilst S. America was the easiest one. Viscosity readings were done using a Brookfield viscometer spindle 7. Peak exotherm and time to peak were measured with a chart recorder at 10 mm/min. Two plaques of each sample were sent for Cone Calorimeter testing.

The formulations containing HA Africa and HA S. America bauxite had viscosities 10 to 20 times lower than the formulation containing ATH. This is an important factor in commercial production. Both HA Africa and HA S. America showed good fire performance in this polyester formulation, as seen in the following results:

| Property | HA Africa | HA S. America |
|---|---|---|
| C.O.I. (%) | 26.1 | 33 |
| Peak Exotherm (C) | 35 | 26 |
| Peak Exotherm ($\mu$V) | 1470 | 1041 |
| Time to Exotherm | 20 min 50 s | 21.0 min |
| Soluble soda (%) | <0.001 | <0.001 |
| pH | 7.6 | 8.3 |

EXAMPLE 3

Samples were tested by thermogravimetry and differential thermal analysis. Samples were S. American high alumina bauxite, African high alumina bauxite, Indian bauxite, brucite and ATH supplied commercially by Alcan Chemicals Limited under the Trade Mark SF11. In this designation, SF stands for Superfine and the FIG. (11) indicates the surface area in $m^2$/g. The results obtained are shown in the following table.

Also included in the table are figures for soluble soda and total soda.

| DTA | Indian Bauxite | HA S. America Bauxite | HA Africa Bauxite | SF11 | Brucite |
|---|---|---|---|---|---|
| Onset of degradation (° C.) | 224 | 223 | 219 | 195 | 331 |
| End of endotherm (° C.) | 318 | 322 | 318 | 304 | 437 |
| Enthalpy (uV/s/g × $10^3$) | 2.99 | 383 | 384 | 373 | 277 |
| Soluble soda (%) | <0.001 | <0.001 | <0.001 | 0.2 | 0.003 |
| Total soda (%) | <0.01 | <0.01 | <0.01 | 0.55 | 0.01 |

The Superfine alumina hydrate shows onset of ATH degradation at 195° C. The bauxites were all approximately 25° C. more thermally stable. By contrast, an FRFLV grade of alumina hydrate was much less thermally stable (results not shown).

EXAMPLE 4

This example shows water absorption properties and cone calorimeter results for a cable formulation based on ethylene vinyl acetate.

Experimental

The following formulation was used (in phr):

| | |
|---|---|
| EVA (Escorene Ultra UL 00119) | 100 |
| Filler | 150 |
| Silane RC1 (from OSI) | 1.5 |
| Irganox 1010 (from Ciba) | 0.5 |

Fillers were used in EVA with the following characteristics:

|  | SF11 | HA Africa | HA S. America | Milled HA S. America | Indian Bauxite | Brucite |
|---|---|---|---|---|---|---|
| $S_w$ m$^2$/g | 10.2 | 12.4 | 12.1 | 11.5 | 8.75 | 7.3 |
| D50 μm | 3.4 | 18.8 | 18.8 | 39 | 13.94 | 11 |
| D10 μm | 0.3 | 5.4 | 4.4 | 0.3 | 0.99 | 1.2 |
| D90 μm | 0.8 | 36.5 | 44.2 | 35.9 | 98.92 | 95.5 |

The Indian bauxite needed a previous treatment before compounding. The as received Indian bauxite was crushed, then milled in an ultracentrifugal mill with a 0.5 ring sieve.

Compounding was done on a two roll mill, the steam generator was set at 100–110° C. Then the following mouldings were done:

Two 3 mm thickness moulds (10×10 cm) for Cone Calorimeter test (irradiance level 40 kW/m$^2$).

3 mm thickness pieces (1 cm width) for COI.

One 1 mm thickness mould (7.7×7.5 cm) for water absorption test.

A water absorption test was performed in a water bath set up at 70° C. The following results were obtained for % water absorption after 1 years immersion.

| Filler | % Water Absorption |
|---|---|
| SF11 | 7.0 |
| HA S. America | 0.63 |
| HA Africa | 0.66 |
| Indian Bauxite | 1.03 |
| Brucite | 3.4 |

As can be seen the bauxite filled samples absorbed less water than the remaining samples. Significant differences were observed between HA Africa and HA S. America in comparison with the alumina hydrate filler. It can be predicted that cables sheathed with formulations containing bauxite flame-retardants will have longer life in contact with water or buried underground than other formulations.

Cone calorimeter results are set out in the following table.

| CONE CALORIMETER RESULTS IN CABLE FORMULATION (EVA) | | | | | | |
|---|---|---|---|---|---|---|
|  | SF11 | HA Africa | HA S. America | Milled HA S. America | Indian Bauxite | Brucite |
| COI (% O$_2$) | 43.8 | 35.9 | 37.5 | 42.8 | 31.5 | 31.8 |
| IGNITABILITY | | | | | | |
| Time To Ignition (s) | 110 | 95 | 110.5 | 130 | 85.5 | 114 |
| Time To Extinction (s) | 1,115 | 932.5 | 1,032.5 | 912.5 | 875 | 592.5 |
| HEAT RELEASE | | | | | | |
| Peak HRR (kW/m$^2$) | 232.1 | 218.3 | 161.5 | 161.7 | 261.8 | 245.6 |
| Time to Peak HRR (s) | 487.5 | 425 | 422.5 | 452.5 | 370 | 395 |
| Total HR (MJ/m$^2$) | 87.3 | 74.8 | 67.8 | 64.6 | 76.6 | 71.8 |
| SMOKE | | | | | | |
| Avg SEA (m$^2$/kg) | 245.8 | 280.8 | 297.3 | 304.7 | 322.1 | 270.2 |
| Total Smoke Release | 831.8 | 799.6 | 771.5 | 794.7 | 884.9 | 713 |
| GAS PRODUCTION | | | | | | |
| Peak CO (kg/m$^2$sx10$^4$) | 1.94 | 2.09 | 1.54 | 1.68 | 2.37 | 1.84 |
| Peak CO$_2$ (kg/m$^2$sx10$^2$) | 1.5 | 1.35 | 1.02 | 1.02 | 1.67 | 1.64 |
| MASS LOSS | | | | | | |
| % Mass Loss | 57.5 | 52 | 49.7 | 48.6 | 54.7 | 50.4 |

The highest COI figures were found for SF11 and HA S. America (milled). Intermediate figures for HA Africa were obtained followed by Brucite and the Indian bauxite. HA S. America milled had a better time to ignition than SF11. Time to extinction was less good for SF11 than for HA Africa and HA S. America. Very small peak release rates was observed in both HA S. Americas. HA Africa gave a better peak than SF11. All bauxites gave lower total heat release than SF11. Brucite gave the smallest total smoke release followed by HA S America and HA Africa; SF11 gave one of the highest figures. The lowest CO$_2$ peaks were found for HA S America and HA Africa. HA S America have low mass loss figures followed by Brucite and HA Africa; highest was SF11.

EXAMPLE 5

Flame-retardant fillers were used having the following characteristics:

| Filler | $D_{50}$ (μm) | $S_w$ (m²/g) | Soluble Soda (%) |
|---|---|---|---|
| ATH SF4 | 1.73 | 3.40 | 0.020 |
| HA S America | 18.8 | 12.1 | <0.001 |
| HA Africa | 18.1 | 12.4 | <0.001 |
| Brucite | 10.96 | 7.38 | 0.003 |

Formulation

Samples tested contained the following formulation: (phr)

| | |
|---|---|
| EVA (Escorene Ultra UL001190) | 100 |
| Filler | 150 |
| S3A | 1.5 |
| Irganox 10.10 | 0.5 |

Procedure 1 mm thick plaques (15×15 cm) were painted with iso-butyl methyl ketone (silver paint) for electrical test as is required. 1 mm thick plaques (7.5×7.5 cm) were made for water absorption test. Water bath was set up to 70° C. A Digital Megohmeter 4250 was used to obtain resistance data at 500V. A Wayne Kerr Automatic LCR meter 4250 was used to obtain capacitance and dissipation factor data. Readings were taken before samples were introduced into the water bath. Consecutive measurements of water absorption and electrical properties were done after 1, 2, 3, 7, 14, 21 and 30 days followed by 2, 3, 4, 5 and 6 months. Samples must be dried properly before any measurement was taken.

Listed below are the calculations used:

Water absorption was expressed as: % of water absorbed=(Actual sample weigh−Initial sample weigh)×100/Initial sample weigh Capacitance was expressed as permitivity (Farads*mm) by using the equation:

$$\epsilon = 144 * T\, Cp./(50)^2 \text{ mmFarads/mm}^2$$

T=Thickness of the sample in mm
50=diameter of cylindrical electrode.

Resistance was expressed as volume resistivity (ohm.cm) from the formula:

$$\rho = \pi/4 * (55)^2 * R:T * 10 \text{ mm}^2 \text{ ohm:(mm*mm/cm)} = 238 * R:T$$

p is Volume resistivity in ohm.cm.
R=Resistance measured in ohm.
T=Thickness of the sample in mm
55=Diameter of Electrode+Midway point of gap in mm
Dissipation factor was expressed as tan (δ).

Results

| Water Absorption from Original Sample (%) | | | |
|---|---|---|---|
| | 1 Day | 28 Days | 6 Months |
| SF4 | 2.5 | 2.9 | 4.4 |
| HA S America | 0.6 | 0.7 | 0.7 |
| HA Africa | 0.5 | 0.7 | 0.7 |
| Brucite | 0.7 | 2 | 3 |

| Volume Resistivity Log (Ohms.cm) | | | |
|---|---|---|---|
| | 1 Day | 28 Days | 6 Months |
| SF4 | 13.0 | 12.7 | 10.9 |
| HA S America | 14.6 | 13.5 | 13.5 |
| HA Africa | 14.8 | 13.9 | 14 |
| Brucite | 15 | 13.4 | 12.8 |

| Permittivity at 1 kHz (Farads/mm) | | | |
|---|---|---|---|
| | 1 Day | 28 Days | 6 Months |
| SF4 | 4.5 | 6.2 | 9 |
| HA S America | 6 | 10.3 | 10.7 |
| HA Africa | 5.1 | 7 | 6.5 |
| Brucite | 5.5 | 9.1 | 8.1 |

| Dissipation Factor (tan δ) | | | |
|---|---|---|---|
| | 1 Day | 28 Days | 6 Months |
| SF4 | 0.028 | 0.050 | 0.069 |
| HA S America | 0.025 | 0.087 | 0.080 |
| HA Africa | 0.028 | 0.074 | 0.070 |
| Brucite | 0.024 | 0.082 | 0.081 |

Discussion

Water Absorption

As expected, low soda samples gave much lower water absorption figures during the 6 months immersed in the water bath. Superfine grades gave the highest values. HA S America and HA Africa were the samples which absorbed the least water followed by Brucite.

Volume Resisitivity (High Values are Desirable)

The same tendency as that for water absorption. Both bauxites gave the best results and properties were stable for the length of the experiment. SF showed a tendency to decrease volume resistivity with time. This was specially notable after the third month reading.

Permittivity (Low Values are Desirable)

HA Africa gave the best results followed by Brucite. All samples but SF4 kept a stable reading during the length of the experiment Although the SF4 gave intermediate values at the first stages, after the second month reading, it started to increase.

Dissipation Factor (Low Values are Desirable)

SF4 gave the best results during the length of the experiment. It was not until month 6 when SF4 started to get worse by increasing dissipation factor.

Conclusions

The tendency to get worse electrical properties and higher water absorption with time for SF4 was found. This was presumably due to a higher amount of sodium content compared with the low cost fillers. Opposite tendency or at least a stable tendency in electrical properties with time was found for HA S America, HA Africa and Brucite.

HA Africa bauxite gave in general the best results in electrical properties and one of the lowest absorption figures. This tendency was followed by HA S America and Brucite.

EXAMPLE 6

The bauxite and brucite fillers were compared to ATH in a simple PVC cable formulation as follows:

| | |
|---|---|
| PVC (DS 7060) | 100 |
| Di-iso octyl phthalate | 50 |
| EZ712 stabiliser (CD33) | 5 |
| Filler | 100 |

Cone calorimetry and COI were conducted on 3 mm thick plaques. A summary of results follows.

| | HA Africa | HA S. America | Brucite | SF11 |
|---|---|---|---|---|
| Burn Time (s) | 499 | 506 | 470 | 592.5 |
| Total Smoke Release | 1,966.4 | 2,069.2 | 1,740.3 | 2,152.7 |
| Total Heat Release (MJ/m$^2$) | 63 | 59.4 | 62.9 | 61.3 |
| Critical Oxygen Index (%) | 30.6 | 31.9 | 30.4 | 31.8 |
| Water Absorption after 7 days (%) | 1.78 | 0.69 | 4.5 | 7.57 |

The data illustrates that burn times are reduced as compared to ATH for both bauxite and brucite. Smoke production is also lower when these fillers are used.

Total heat release and critical oxygen index are comparable for the fillers tested.

What is claimed is:

1. Electric or fiber optical wire or cable provided with insulation or sheathing which is a non-aqueous organic polymer containing unactivated bauxite in an amount of 20–500 parts by weight per 100 parts by weight of the organic polymer as a flame-retardant, wherein the bauxite is an uncoated high-alumina bauxite having a soluble soda content below 0.01% by weight.

2. Electric or fibre optic wire or cable according to claim 1, wherein the organic polymer is selected from polyolefines, polyolefine copolymers and terpolymers including polyethylene and copolymers, polyvinylchloride, natural rubber, synthetic rubber, polypropylene, polyester and ethylene vinyl acetate.

3. Electric or fibre optic wire or cable as claimed in claim 1, wherein the insulation or sheathing is formulated to withstand frequent or constant contact with water.

4. Electric or fiber optic component or connection coated with or encapsulated in a non-aqueous organic polymer containing unactivated bauxite in an amount of 20–500 parts by weight per 100 parts by weight of the organic polymer as a flame-retardant, wherein the bauxite is an uncoated high-alumina bauxite having a soluble soda content below 0.01% by weight.

5. Electric or fibre optic component or connection according to claim 4, wherein the organic polymer is selected from polyolefines, polyolefine copolymers and terpolymers including polyethylene and copolymers, polyvinylchloride, natural rubber, synthetic rubber, polypropylene, polyester and ethylene vinyl acetate.

6. Electric or fibre optic component or connection as claimed in claim 4, wherein the coating or encapsulation is formulated to withstand frequent or constant contact with water.

* * * * *